United States Patent [19]
Lin et al.

[11] Patent Number: 5,778,386
[45] Date of Patent: Jul. 7, 1998

[54] GLOBAL VIEW STORAGE MANAGEMENT SYSTEM FOR SEMICONDUCTOR MANUFACTURING PLANTS

[75] Inventors: Chin-Mou Lin; Chin-Fu Lin, both of Hsin-Chu, Taiwan

[73] Assignee: Taiwan Semiconductor Manufacturing Company Ltd., Hsin-Chu, Taiwan

[21] Appl. No.: 654,365

[22] Filed: May 28, 1996

[51] Int. Cl.⁶ .................................................. G06F 17/30
[52] U.S. Cl. ........................... 707/200.1; 707/1; 707/3; 707/7; 707/10; 395/208; 395/228; 364/468.02; 364/468.2; 364/468.22; 364/468.23; 364/468.28
[58] Field of Search ..................... 395/228, 208, 395/600, 601, 603, 607, 610; 364/468.02, 468.2, 468.22, 468.23, 468.28

[56] References Cited

U.S. PATENT DOCUMENTS

| | | | |
|---|---|---|---|
| 5,193,065 | 3/1993 | Guerindon et al. | 364/468 |
| 5,210,041 | 5/1993 | Kobayashi et al. | 437/8 |
| 5,219,765 | 6/1993 | Yoshida et al. | 437/8 |
| 5,240,866 | 8/1993 | Friedman et al. | 437/8 |
| 5,416,694 | 5/1995 | Parrish et al. | 364/401 |
| 5,548,756 | 8/1996 | Tantry et al. | 395/600 |
| 5,594,893 | 1/1997 | Byers et al. | 395/557 |
| 5,606,693 | 2/1997 | Nilsen et al. | 395/610 |
| 5,668,986 | 9/1997 | Nilsen et al. | 395/610 |

*Primary Examiner*—Wayne Amsbury
*Assistant Examiner*—Shahid Alam
*Attorney, Agent, or Firm*—George O. Saile; Stephen B. Ackerman; Graham S. Jones, II

[57] ABSTRACT

A computer operated method comprises a sequence of steps for management of data of a manufacturing operation with workstations in several different functional locations. The manufacturing operation is configured to perform a specific task at each location. Data for lots of work located in containers in the plant is read. The data which has been read is sent through a polling engine for transmission to be collected in a database system. The collected data is then supplied from the database system to a plurality of programmable workstations which are linked to the database by lines in a star network.

20 Claims, 11 Drawing Sheets

GLOBAL VIEW STORAGE MANAGEMENT SYSTEM FOR SEMICONDUCTOR MANUFACTURING PLANTS

BACKGROUND OF THE INVENTION

1. Field of the Invention

This invention relates to data processing systems for interactive control of manufacturing/fabrication and more particularly to an improved system for management of access to data stored in such a data processing system.

2. Description of Related Art

In manufacturing systems there are conflicting objectives such as minimizing inventories to efficient levels; minimizing delays in production by providing sufficient inventory and manufacturing equipment including backup equipment to prevent delay in the event of equipment breakdown while on the other hand minimizing the cost manufacturing facilities to an efficient level with minimal unnecessary idle machine time. These and other objectives conflict and methods of optimization of manufacture are needed to deal with these conflicting objectives.

Manufacturers are using improved methods to satisfy increasing customer demands for higher quantity products, fast and reliable delivery, product customization, more options, reduced cycle time, lower costs, while at the same time minimizing working capital requirements and operating costs.

Push and Pull process flow control techniques can be used. In the case of the Pull technique, wafers are pulled back up-stream to stages closer to the beginning of the production line from the previous stages in the fabrication line to the greatest degree possible. In the case of Push flow control, wafers are pushed down-stream to the next stage in the fabrication line to the greatest degree possible.

In the Just In Time (JIT) method of process flow control, ideally work is to arrive at the work station just as it is needed without any extra inventory being provided at the work station.

KANBAN SYSTEM

The Kanban system is an implementation of the JIT approach. It is a requirement-driven mode of production in which variations in demand are absorbed by scheduling excessive capacities, together with the use of a flexible production mode. The aim is to minimize the amount of WIP (Work In Progress) by minimizing intermediate inventory stock along the manufacturing line and inventories of the finished product and to attain a method of order-driven procurement and "Just-In-Time-Production".

The Kanban system works using a very simple control mechanism. Containers of a standard size are adapted to contain the work being processed on a production line. Each container always has a card ("Kanban") attached thereto. The card controls the itinerary of the container throughout the production process. Each "Kanban" card contains information specifying the parts and quantities which are required to meet a sales order. The production department takes these Kanban cards as orders. Kanbans are also, in turn, sent to preceding departments in the production process. Each card contains information describing the article of manufacture, the manufacturing operation, the required quantity and, if required, any deadline specifications. A single card at least provides information concerning which parts and how many parts are to be produced from the initial products available.

Alternatively, a mixed model Push technique and Pull technique arrangement can be used. The key to production scheduling with the mixed model is to coordinate the required items from different categories to quickly fill customer demands. Items are replenished as they are consumed by the final assembly schedule (pull). Simultaneously, stocked items are planned and ordered (push). Forecasting and planning are used to replenish these stocked items. In a supply oriented mode of production fluctuations in demand are counterbalanced by using available stocks, in order to keep the production process as regular as possible.

Controls for mixed model manufacturing are the Kanban replenishment card and the job order. When Kanban items need to be replenished, a Kanban signal (in the form of a card, bin or other highly visible mechanism) is sent to the appropriate manufacturing cell.

To implement a JIT, Push, Pull, mixed Push/Pull, Kanban or other system, a data processing system is required to communicate with the various machines and personnel in the manufacturing/fabrication plant.

With any system such as a Kanban system, data processing can facilitate efficient implementation.

DISTRIBUTED DATA PROCESSING SYSTEM

In a data processing system for use in a manufacturing plant a distributed data processing requires a system for transmitting data in blocks or packets between a number of computers efficiently is required. A block is a group of bits or characters that is transmitted as a unit. A packet is a frame or block of data used for transmission in packet switching and other communications methods.

DATA TRANSMISSION PROTOCOL

To perform the function of data transmission of data one of the important tools required is a communications protocol which is a set of rules governing transmitting and receiving of data with a set of semantic and syntactic rules that determines the behavior of functional units in achieving communication. In data processing, OSI (Open Systems Interconnection) architecture, a protocol is a set of semantic and syntactic rules that determine the behavior of entities in the same layer in performing communication functions.

COMPUTER COMMUNICATIONS PROTOCOLS

A communications protocol is a set of rules or standards for hardware and software standards that enable computers to connect with one another and to exchange information with as little error as possible. The protocol governs transmission between two stations. A protocol is a standard way of regulating data transmission between computers, such as handshaking, X-OFF, X-ON, XMODEM and KERMIT. On personal computers, communications programs offer a variety of protocols such as KERMIT, XMODEM, ZMODEM, etc., to transfer files via modem.

Standards governing data transmission include parameters and handshaking signals (such as X-ON/X-OFF) used in asynchronous (typically, modem) communications, as well as such data-coding methods as bit-oriented and byte-oriented protocols. Still other protocols, such as the widely used XMODEM, govern file transfer, and others yet, such as CSMA/CD, define the methods by which messages are passed around the stations on a local area network. Taken as a whole, these various and sometimes conflicting protocols represent attempts to ease the complex process of enabling computers of different makes and models to communicate.

Some of the terms employed in this application are defined here to avoid any confusion as to the meaning of those terms as used herein.

GLOSSARY

DOS (Disk Operating System of Microsoft Corp.) as referred to herein is a single user program for a microcomputer (PC.)

X-OFF and X-ON are codes that turn on or turn off data transmission from a computer to a terminal to control the flow of data. Many computers are programmed in such as way that if the user a terminal types CTRL S (X-OFF), the computer will stop transmitting until the user types CTRL Q (X-ON). In transmission between computers these signals can be used for controlling the data transmission rate to prevent the transmitting computer from being too far ahead of the receiving computer.

XMODEM is a protocol for transmitting files from one microcomputer to another and detecting transmission errors if they occur in which the transmitting computer transmits 128-byte blocks of data each of which is followed by a check-sum based on the characters transmitted; and then the receiving computer computes a check-sum from the characters it receives and checks whether the two sums agree. If they agree the receiving computer asks for the next block of data. If they disagree, the receiving computer asks for retransmission of the original block of data.

KERMIT is a protocol for transmitting files from one computer to another and a program provided free by Columbia University for performing that function. Like XMODEM, KERMIT makes an exact copy of an original file, even when transmitting on a noisy line, by means of error checking and retransmission of erroneous data packets. The file name is sent along with the file. A group of files can be sent by using wild card characters in file names.

LAT (Local Area Transport) of DEC (Digital Equipment Corp.) is a communications protocol for controlling terminal traffic in a DECnet (DEC network) environment.

Currently a data processing system known as the Storage Management System (SMS) runs in a non-preemptive multitasking DOS base environment. The connection between Storage Management System (SMS) and the host computer is provided through the LAT protocol. A problem with the LAT protocol is noise sensitivity, and thus, communication reliability is always a matter of concern.

The LAT user interface is in the text mode (alphanumeric), not graphic, and the Chinese language is not included in the alphanumeric data implemented therein. A most important factor in connection with this invention is that the Storage Management System (SMS) was designed to be localized to a a particular portion of a fabrication plant.

LOT: A set of workpieces being fabricated together as a group.

WAFER CASSETTE: A container holds a plurality of silicon semiconductor wafers for automatic handling in an automated semiconductor manufacturing system.

POD: A device for holding a wafer cassette.

RACK: A device which can hold a pod.

LAYER: There are four layers in a rack and each layer holds four trays which holds pods.

STOCKER: A term for a set of racks.

TAG: An electrical device with a liquid crystal display for displaying lot information.

SC: A Storage Controller which is a computer which manages trays in a rack.

The rack system as referred to herein is a commercially available product of Asyst Technology Inc.; wherein the rack system includes four layers in a rack, and each layer has four trays to hold pods.

"PROMIS" (PROcess Manufacturing Integration System) is a technically advanced, factory automation and management system including a shop floor control system available from PROMIS System Corporation. The PROMIS system plans, monitors, and controls activity in complex process manufacturing environments.

Multitasking: A preemptive multitasking method shares processing time with all running programs. Preemptive multitasking creates a true time-sharing environment in which all running programs get a slice of time from the CPU which may be equal for all programs or adjustable. In a non-preemptive multitasking environment an application is able to give up control of the CPU to another application only at certain points, such as when it is ready to receive data from the keyboard.

DATABASE MANAGEMENT SYSTEM

ORACLE is a software system comprising a relational DBMS (DataBase Management System) from Oracle Corp. Such database systems run on a wide variety of computers from microcomputers to mainframes incorporating SQL language in which database applications can be created on a microcomputer and easily moved to other hardware platforms.

STORAGE MANAGEMENT SYSTEM

One cannot get plant-wide lot fabrication information with a Storage Management System (SMS) alone. In the previous state of the art, for a user to gain access to plantwide lot fabrication information, the user has been required to go through each and every Storage Management System (SMS) in the manufacturing/fabrication plant before finding the location of data concerning all of the lot(s) being processed. Since the Storage Management System (SMS) has a LAT communication protocol, it is not open. That is to say that each workstation is isolated. After the Storage Management System (SMS) is restarted (for any reason) the SMS polls every lot from stocker and gets lot information from the host computer with the results that the computer network is being kept too busy and the PROMIS plant manufacturing system is being kept too busy. Those problems are of great concern to operators of semiconductor manufacturing plants, since they lead to serious delays in manufacturing.

Visual Basic is a version of BASIC from Microsoft specialized for developing Windows applications. User interfaces are developed by dragging objects from the Visual Basic Toolbox onto the application form. A toolbox is a set of software routines which allow a program to be written for and to work in a particular environment. The routines are called by the application program to perform various functions, for example, to display a menu or draw a graphic element.

The SEMI Equipment Communications Standard Part2 (SECSII) defines the details of the interpretation of messages exchanged between intelligent equipment and a host. The messages defined in the standard support the most typical activities required for IC (Integrated Circuit) manufacturing. SECSII gives form and meaning to messages exchanged between equipment and host using a message transfer protocol, such as SECSI. SECSII defines the method of conveying information between equipment and host in the form of messages. These messages are organized into categories of activities, called streams, which contained specific messages, called functions.

PROMIS System Corporation's PROcess Manufacturing Integration System is a technically advanced, commercially available factory automation and management system. It plans, monitors, and controls activity in complexity process manufacturing environments.

SUMMARY OF THE INVENTION

A computer operated method of management of data of a manufacturing operation with workstations in several different functional locations configured to perform a specific task at each location comprises the steps as follows:

Read data for lots in containers in the plant. Send the data through a polling engine for transmission to a database system. Supply data from the database system to a plurality of programmable workstations linked lines in a star network to the database.

Preferably, the polling engine sends the data to a bin in the database system; include dynamic on-line reconfiguring a storage management programmable workstations by sending thereto reconfiguring signals over the star network, whereby the programmable workstation is reconfigured to perform the function of a different functional location.

Preferably, security control is provided between the database system and the programmable workstations; and a graphical user interface is provided.

In accordance with another aspect of this invention, a computer operated method of management of data of a manufacturing operation with workstations in several different functional locations configured to perform a specific task at each location comprising the steps as follows:

Read data for lots in containers in the plant.

Send the data through a polling engine for transmission to a database system.

Communicate between the polling engine and a host computer containing lot information.

Supply data from the database system to a plurality of storage management programmable workstations linked lines in a star network to the database.

Preferably, the polling engine sends the data to a bin in the database system; include dynamic on-line reconfiguring a storage management programmable workstations by sending thereto reconfiguring signals over the star network, whereby the programmable workstation is reconfigured to perform the function of a different functional location.

Preferably there is dynamic on-line reconfiguring the storage management programmable workstations by sending thereto reconfiguring signals over the star network. The programmable workstation is reconfigured to perform the function of a different functional location.

Preferably, a graphical user interface is provided, and a colorful graphical user interface is provided.

In accordance with the invention, a computer system for management of data of a manufacturing operation with workstations in several different functional locations configured to perform a specific task at each location comprising the steps as follows:

Means for reading data for lots in containers in the plant.

Means are provided for sending the data through a polling engine for transmission to a database system.

Means are provided for supplying data from the database system to a plurality of programmable workstations linked lines in a star network to the database.

The polling engine sends the data to a bin in the database system.

There is dynamic on-line reconfiguring a the storage management programmable workstations by sending thereto reconfiguring signals over the star network.

whereby the programmable workstation is reconfigured to perform the function of a different functional location.

The invention includes providing security control between the database system and the programmable workstations; including providing a graphical user interface; a computer operated system of management of data of a manufacturing operation with workstations in several different functional locations configured to perform a specific task at each location comprising the steps as follows:

Read data for lots in containers in the plant.

Send the data through a polling engine for transmission to a database system.

communicating between the polling engine and a host computer containing lot information.

supply data from the database system to a plurality of storage management programmable workstations linked lines in a star network to the database.

The polling engine sends the data to a bin in the database system; includes dynamic on-line reconfiguring of the storage management programmable workstations by sending thereto reconfiguring signals over the star network.

whereby the programmable workstation is reconfigured to perform the function of a different functional location.

Include a graphical user interface and provide a colorful graphical user interface.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

1. In accordance with this invention, the Storage Management System (SMS) is divided into two sub-systems. One of them includes a polling engine PE1 which maintains correct lot information in database DB 226. The other supports a colorful graphical user interface which is in Chinese mode.

Thus the present invention both enhances system robustness (efficiency and reliability) and shortens the TE (Technical Engineer) learning curve.

Figure 1A:
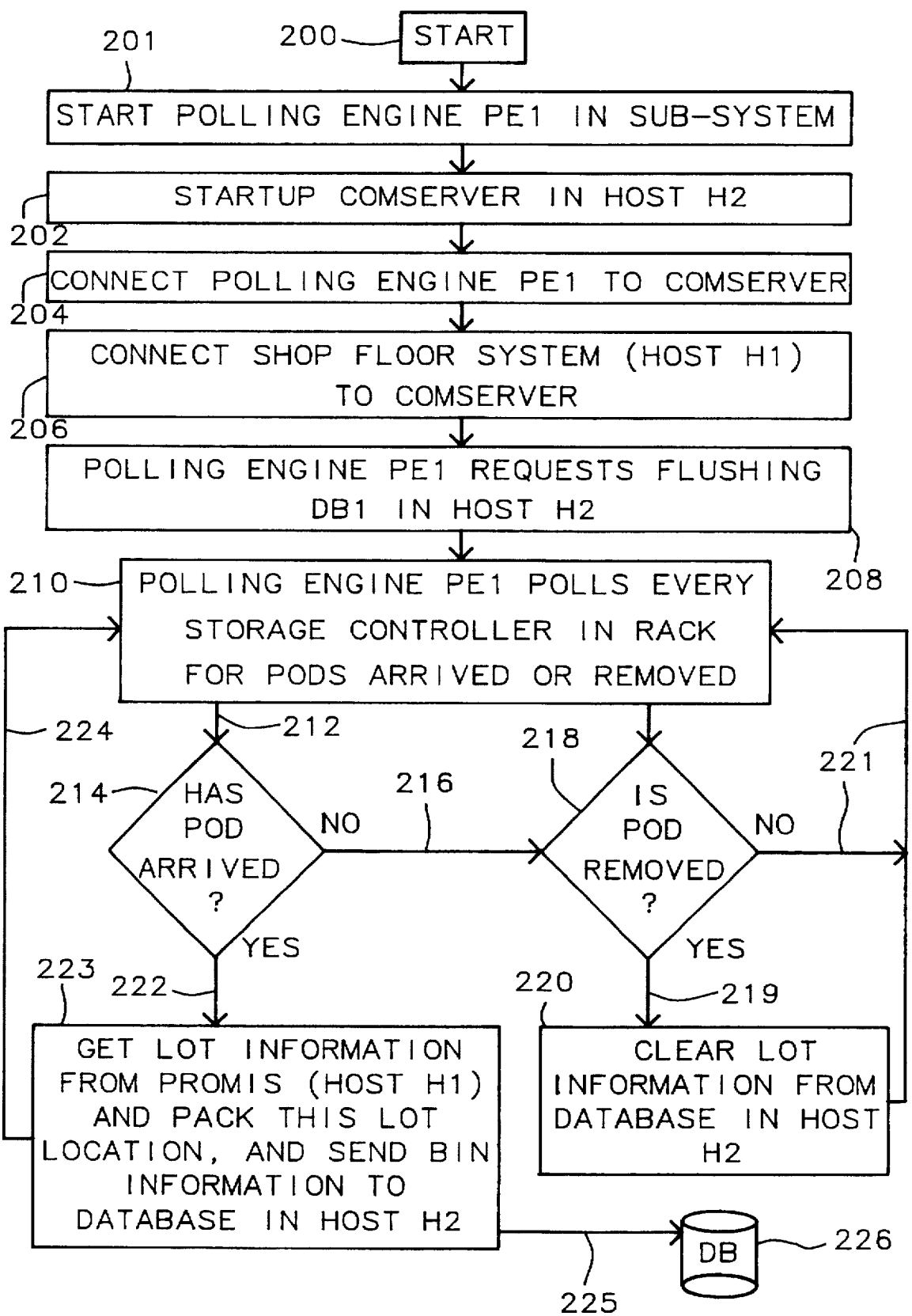
FIGS. 1A and 1B provide a high level flow chart of the program which operates each of the two sub-systems of FIG. 1C and FIG. 2.
Figure 1B:
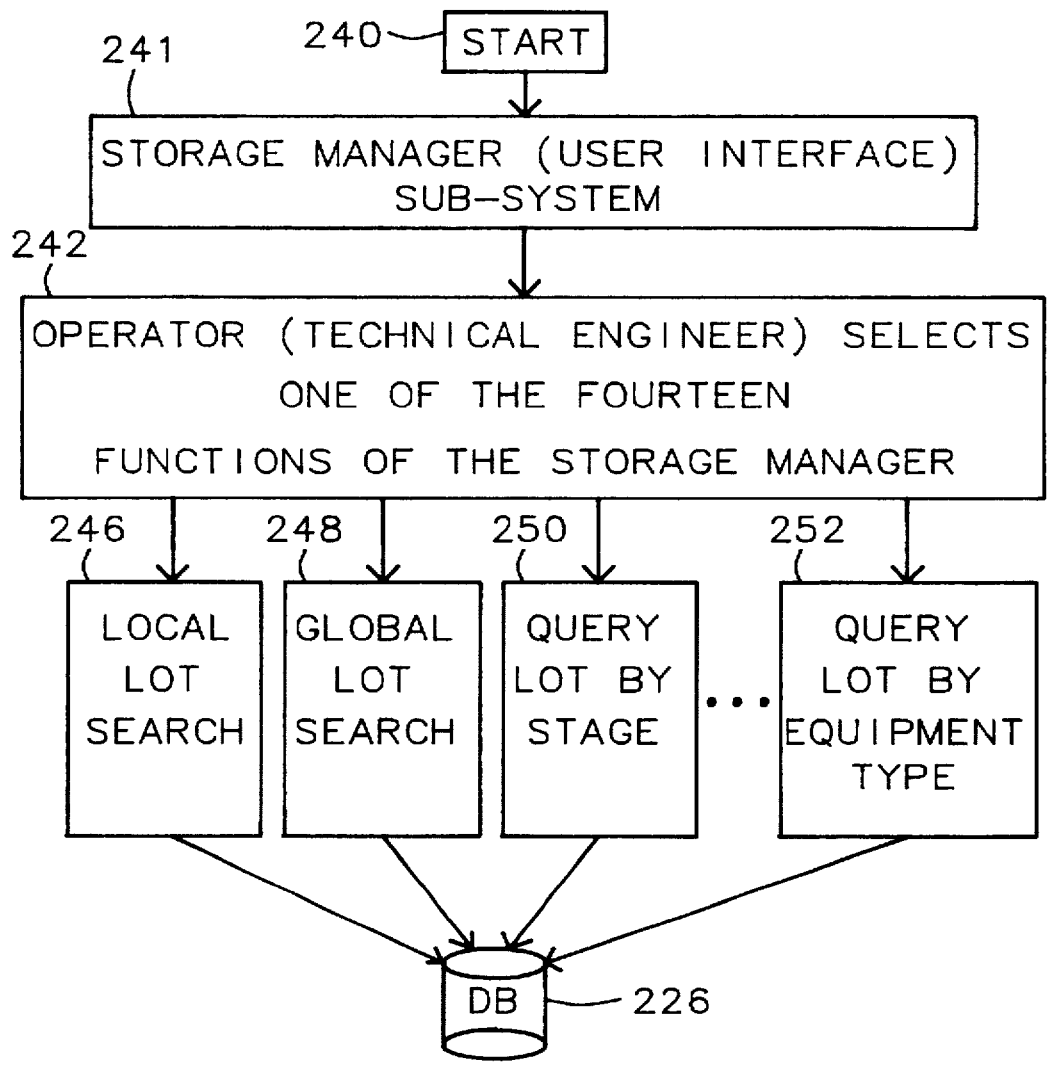
Figure 1C:
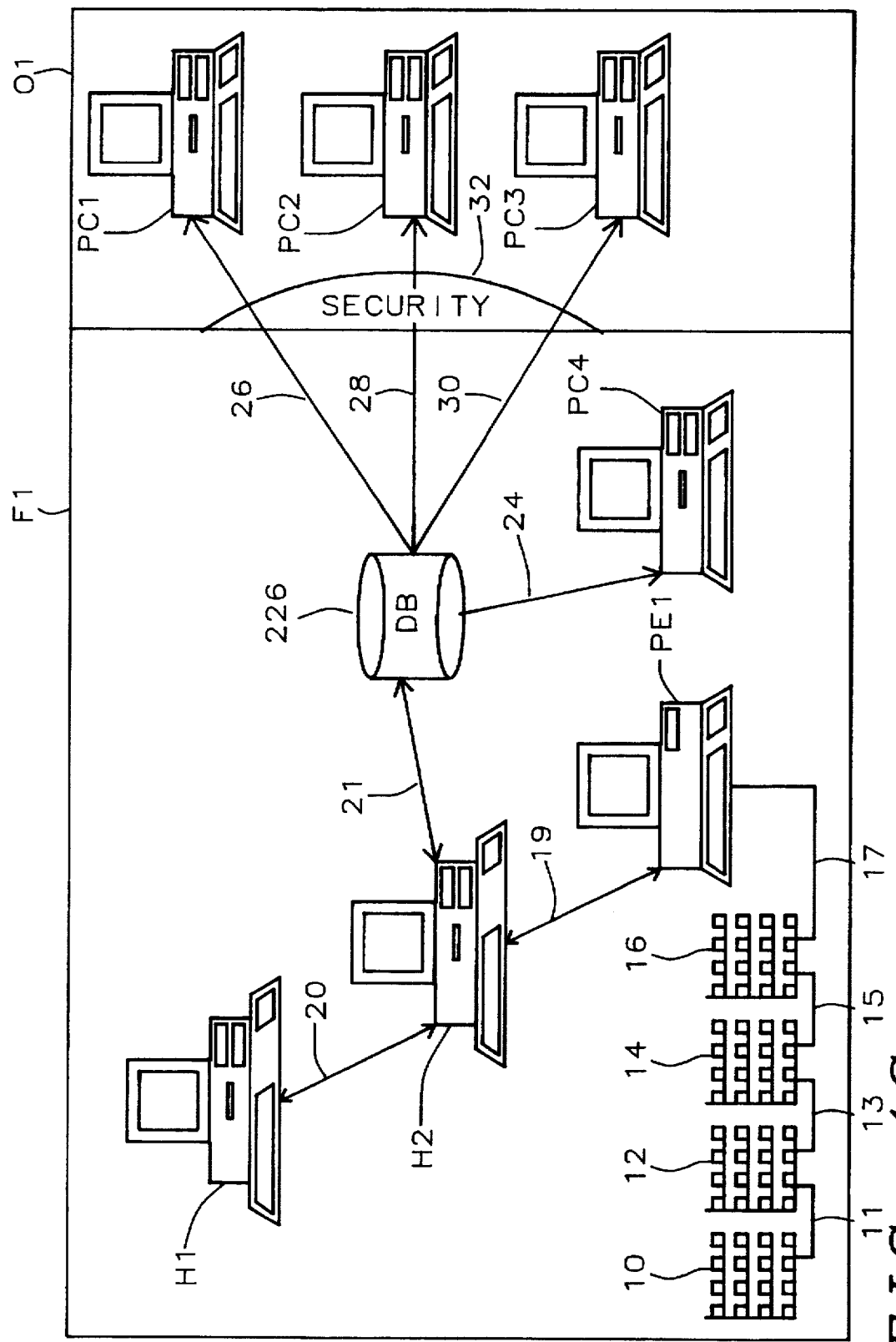
FIG. 1C is a block diagram of hardware for a data processing network for control of a fabrication plant both in the factory location and in the office location.
Figure 2:
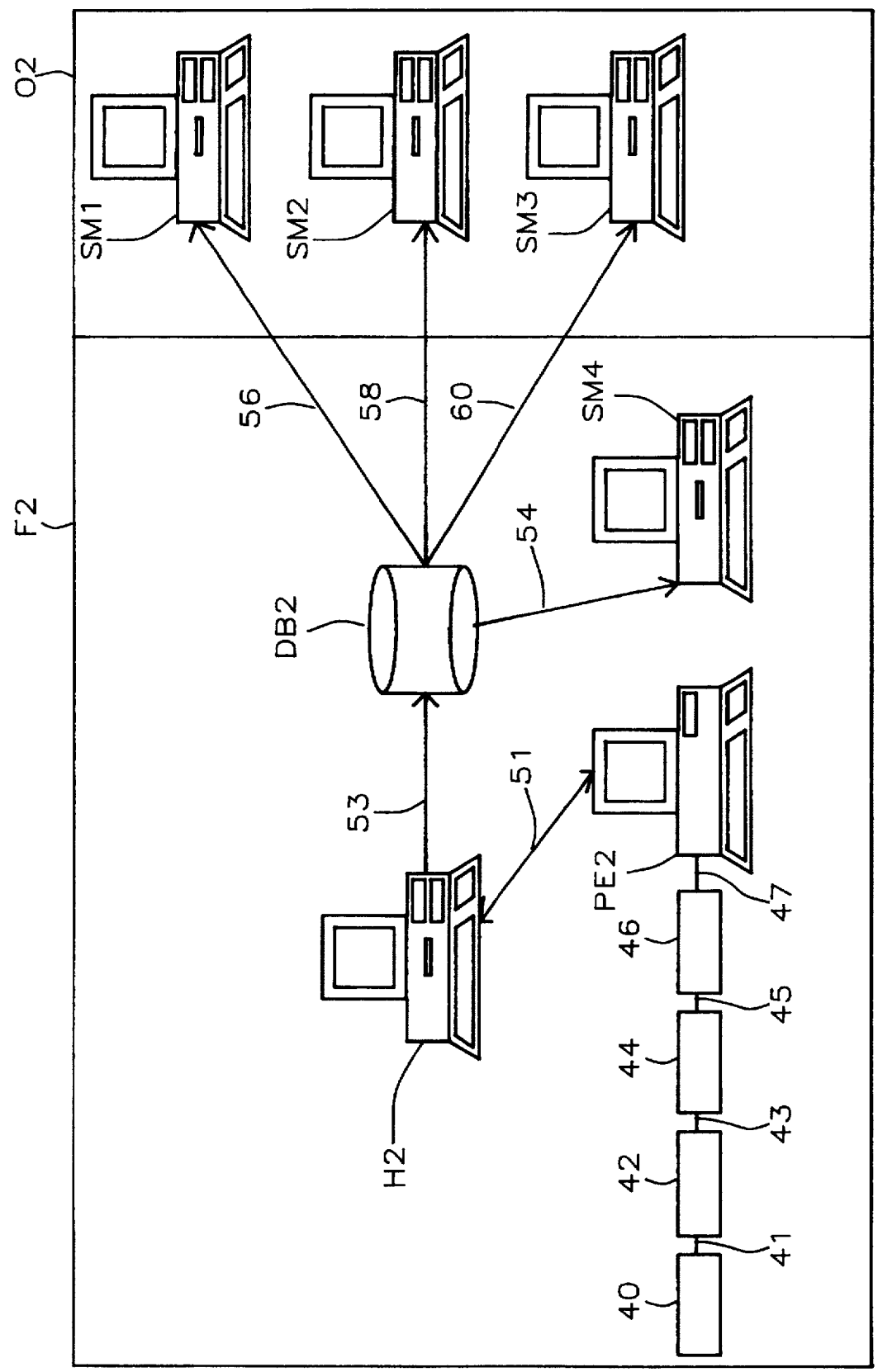
FIG. 2 shows a block diagram of hardware in accordance with Storage Management System (SMS) architecture for a data processing control network for a fabrication plant.

FIGS. 1A and 1B provide a high level flow chart of the program which operates each of the two sub-systems of FIG. 1C and FIG. 2.

FIG. 1A shows a first portion of a high level flow chart commencing with step 200 for initiating the step 201 of polling a subsystem engine. At the end of step 202, the system starts up the comserver program located in the host H2 in FIG. 1C. The next step 204 connects the polling engine PE1 in FIG. 1C to the comserver program in host H2. Next in step 206, the system connects the shop floor control system H1 in FIG. 1C to the comserver program in host H2. In the next step 208, the polling engine PE1 requests flushing the database DB 226 in host H2. Following step 208, the polling engineer PE1 polls every storage controller in racks for pods arrived or removed.

Next, the line 212 leads to decision step 214 in which the system determines whether a pod has arrived at the storage controller. If YES, then the system goes on line 222 to step 223. If NO, then the system goes on line 216 to decision step 218.

In step 223, the system gets lot information from the (PROMIS) plant manufacturing system located in host H1 and packs this lot location and sends BIN information to the database 226 in host H2 via line 225. After step 223, the system goes back on line 224 to step 210 to proceed to the next storage controller in the sequence.

In decision step 218, the system determines whether a pod has been removed from the storage controller. If YES, then the system goes on line 219 to step 220. If NO, then the system goes on line 221 back to step 210 to proceed to the next storage controller in the sequence.

In step 220, the system clears lot information from the data base system located in host H2. Then the system goes back on line 221 to step 210 to proceed to the next storage controller in the sequence.

FIG. 1B shows the other portion of the high level flow chart which starts in step 240 which leads to step 241 in which the storage manger (user interface) sub-system 241. In step 242 the operator (technical engineer) interactively selects one of the fourteen functions of the storage manager program. Among the fourteen functions of the storage manager program selected are local lot search 246, global lot search 248, query lot by stage 250 ... and query lot by stage 252 which are also connected to the database 226 in host H2 as is step 223 in FIG. 1A.

2. System communication is provided through TCP/IP (Transmission Control Protocol/Internet Protocol—which is a de facto UNIX standard for transmitting data in packets between computers for use in the Internet. This system communication or TCP/IP has much better performance and thus steps into an OPEN environment. OPEN refers to OPEN Systems which are designed to interconnect with a variety of products such as UNIX-based systems.

3. The system in accordance with this invention supports global lot search function which helps the user to find lots on a plant-wide basis in the fabrication plant. Since every polling engine sends lot information into the central database it is easy to support a global lot search because all of the information pertaining to the lots is in the central database 226.

4. An algorithm implemented in the polling engine skips a lot query to the PROMIS plant manufacturing system if one lot has not been moved in rack, thus, reduces the PROMIS system loading. This is described in detail below with reference to FIG. 8.

Figure 10:
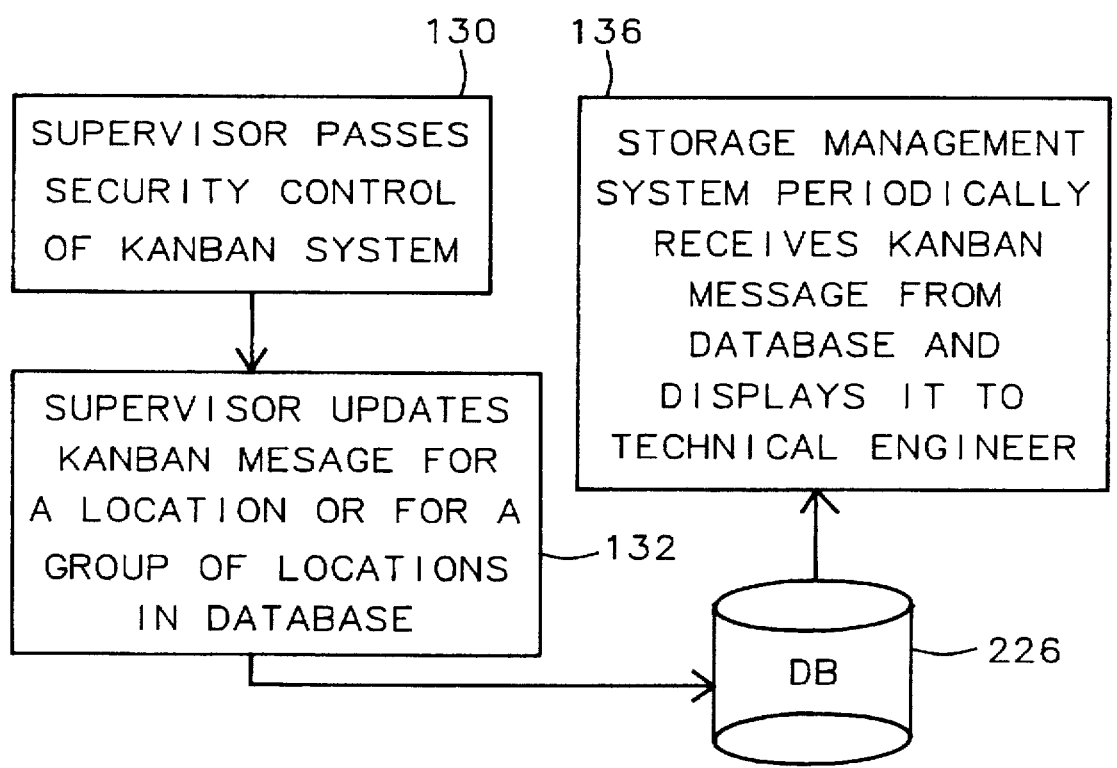
FIG. 10 is a high level flow chart shows how the Kanban function is added to the SMS.

5. A Kanban function is added on Storage Management System (SMS). FIG. 10 is A high level flow chart to show how the Kanban function is added to the SMS which is described below.

Figure 11:
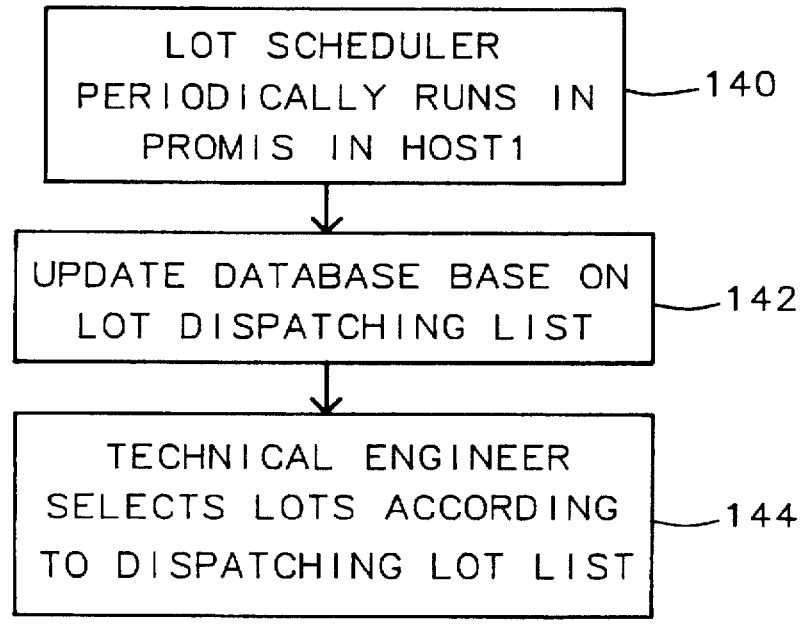
FIG. 11 is a high level flow chart which shows how functions are added to the SMS.

6. Combine lot scheduling system, local dispatching function is implemented in Storage Management System (SMS), too as shown in FIG. 11 which is described below.

Figure 12:
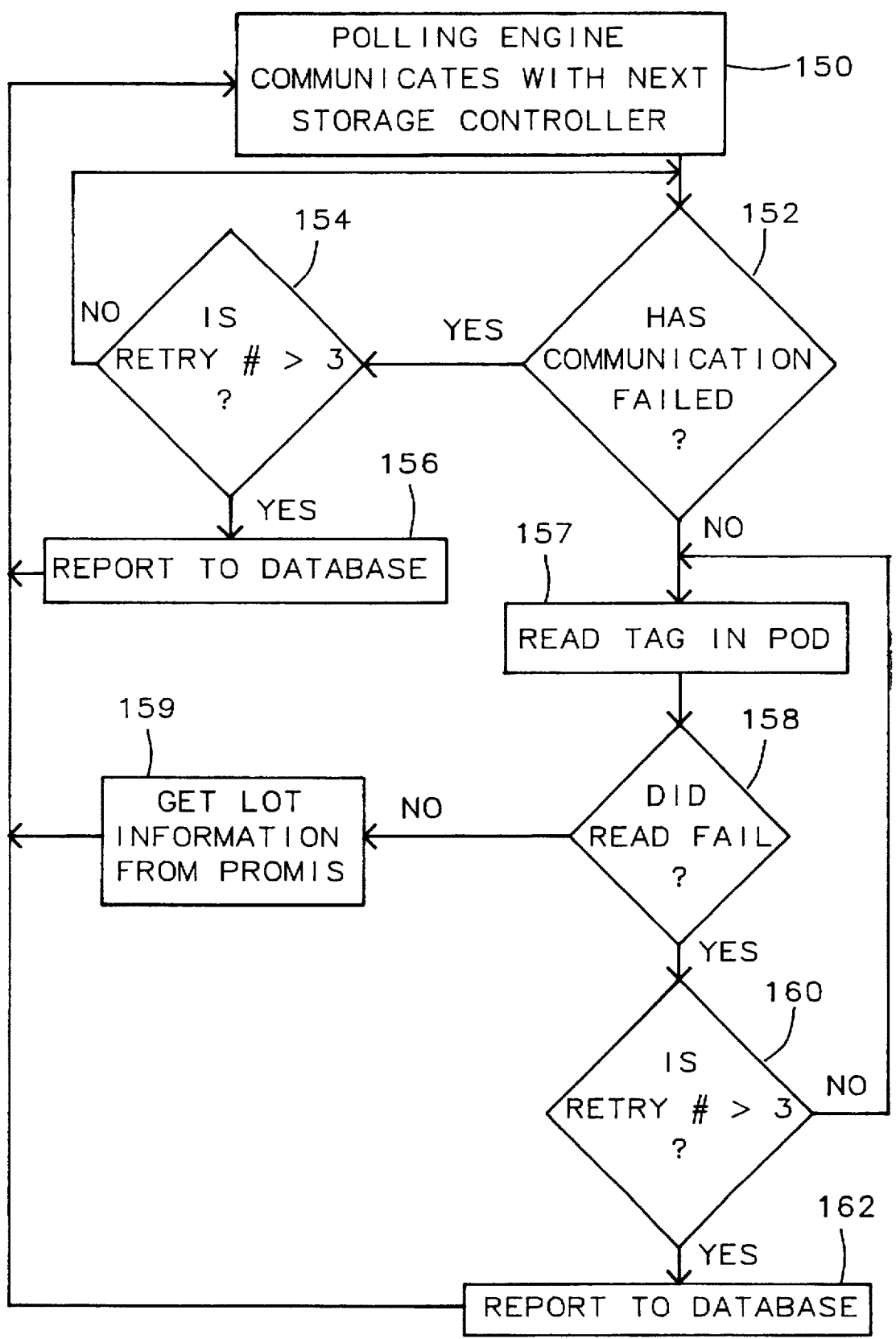
FIG. 12 is a flowchart for diagnostic hardware (storage controller, Tag, Tray) status.

7. Diagnostic hardware (storage controller, Tag, Tray) status. FIG. 12 is a high level flow chart to show how such diagnostic hardware status data is produced which is described below.

Figure 13:
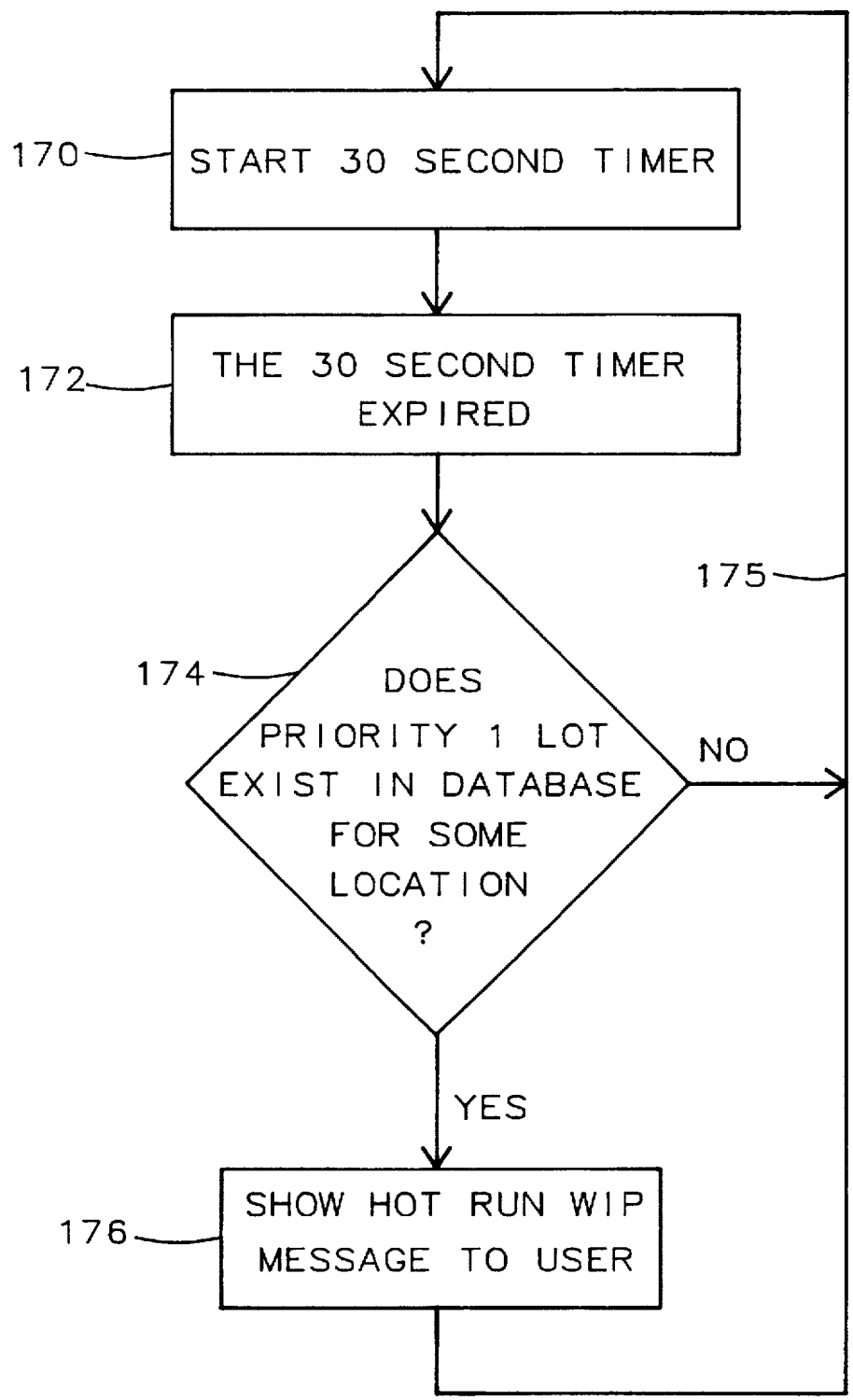
FIG. 13 is a flowchart of a routine for On time display hot run WIP (Work In Progress wafer).

8. On time display hot run WIP (Work In Progress wafer). FIG. 13 is a high level flow chart to show how such this function is performed. FIG. 13 is described below.

FIGS. 1C and 2 describe system hardware architecture. Flowcharts herein describe the software algorithms for performing functions of the system in accordance with this invention.

In accordance with this invention, there are two sub-systems which form a Storage Management System (SMS) shown in FIGS. 1C and 2.

One sub-system is the polling engine PE1 shown in FIG. 1C which runs in QNX OS. Its job is to obtain lot information from the PROMIS plant manufacturing system in the host computer H1.

The other sub-system is Storage Manager (SM) providing a colorful graphical user interface.

FIG. 1C is a block diagram of hardware for a data processing network for control of a fabrication plant both in the factory location F1 and in the office location OL1. A host computer H is shown located in the fabrication plant with a bidirectional transmission link 20 to a microcomputer comprising a polling engine PE1. The polling engine PE1 is connected to receive data on line 17 from the rack units and lines 10–17 and to supply data from the host computer H and the racks on line 22 to the Oracle database DB 226 in host H2. DB 226 is a database which resides in a microcomputer H2. Host H1 is a VAX computer in which the PROMIS plant manufacturing system resides. Host H2 is a VAX microcomputer which serves as a message router. Host H2 transfers messages from polling engine (through TCP/IP protocol) to host H1 (through DECNet protocol). Besides, host H2 stores lot information into database DB 226. The reason why we need host H2 as a router in the host H1 PROMIS plant manufacturing system supports DECNET protocol which is not OPEN. PEI OS (QNX) does not support DECNet environment. So we must have a computer support both TCP/IP and DECNet protocols.

Polling engine PE1 runs in the QNX OS (Operating System). The job of polling engine PE1 is to obtain lot information via cable 20 from host computer H which contains the PROMIS plant manufacturing system program, according to the lot ID (Identification) of the lot in rack units 10–17.

The rack system is a product of Asyst Technology Inc. There are four layers in a rack, and each layer has four trays to hold pods. For a rack, there are two Storage Controller (SC) to manage trays in rack. Each storage controller manages two layers of trays. Thus, each storage controller manages eight trays in a rack.

Each storage controller is an Intel 8086 based computer which connects to its eight trays by an electrical cable. There are two switches in a tray to sense when a pod arrives or a pod is removed.

Each storage controller has its unique ID in a rack system. Generally its name is from 0 to 31, at most. Because only five bits are allocated to the storage controller ID, 31 is the uppermost ID in this system.

Each storage controller is linked through a daisy chain. When the polling engine PE1 starts polling, it starts from SC0, then SC1, SC2, . . . until the end of the last SC. Whenever a storage controller is polled, the storage controller reports its status to polling engine PE1. This status includes two parts, one is "pstat" which relates to tray status. The other is "pchg" which records pod status of arrival or removal.

The status pstat means if there is a pod in a tray, the storage controller senses presence of the tray through tray sensor switches, and mark it in the storage controller internal corresponding bit. If a pod is removed, the storage controller also senses the absence of the pod and clears its corresponding bit.

The status pchg means that regardless of whether a pod arrives or a pod is removed, the storage controller always keeps this status change in its internal corresponding bit. Of course, in each polling phase, it will report no change if no pod is either arriving or being removed.

The status pchg will be reset after being polled but pstat always reports the correct tray status.

HOW POLLING ENGINE PE1 COMMUNICATES WITH RACK SYSTEM

As mentioned above, the storage computers operate in a rack system as a daisy chain. The polling engine PE1 polls all storage computer starts from the first storage computer (SC0). After collecting the related pchg and pstat information from the SC being polled, polling engine realizes which pod is new being put on the tray. The polling engine PE1 reads the lot ID from a tag which is attached to each pod. According to the lot ID, the polling engine PE1 sends lot information requested to the router computer host H2 to obtain lot information from the PROMIS program in host H1. In the mean time, router H2 sends lot basic information (lot id, location, bin) to the database 226.

After getting lot information from the PROMIS system in host H1 through router H2, polling engine PE1 interprets this information and send it back to router H2 to store this lot information into database 226. In this way, a full set of lot information is stored in database 226.

After each new tray being put on a pod and lot information has been collected, the polling engine polls the next storage controller in this same manner. When the last storage controller has been polled, the polling engine PE1 re-polls from SC0, the first storage controller in the rack system. For management reasons, the polling engine sleeps 21 seconds for every 3 seconds the storage controllers have been polled.

Whenever a pod is removed, the storage controller realizes it and mark its corresponding internal bit. When polling engine polls it, it reports that a pod has been removed in its pchg and pstat bytes. With this information, polling engine send clear lot information request to router to clear corresponding lot information in database.

The database DB 226 is connected in a radial or star network in which the database DB 226 is associated with the central controller or computer H2 in which database DB 226 is connected by lines 24, 26, 28 and 30 to the programmable workstations comprising personal computers (microcomputers, workstations or intelligent terminals) PC1, PC2, PC3, and PC4, each of which has features including among other things, a CPU, a memory, a storage disk, a keyboard and a video display terminal, and ancillary circuits.

In FIG. 1C the host H2 on which the data base 226 resides is a server.

FIG. 2 shows a block diagram of hardware in accordance with Storage Management System (SMS) architecture for a data processing control network for a fabrication plant. Interactive programmable workstations are located at stations in both the factory location F2 and in the office location OL2. A polling engine PE21 is provided. Polling engine PE1 runs in QNX OS (Operating System). The job of polling engine PE1 is to collect data from rack units and lines 40–47 and then to send lot information via cable 52 to oracle database DB2. The database DB2 is connected in a radial or star network in which the database DB2 is the central controller or computer in which database DB2 is connected to microcomputers, workstations (personal computers) SM1, SM2, SM3, and SM4. The polling engine PE2 obtains such information according to the lot ID (Identification) of the lot in rack units and lines 40–47. The storage manager system SM can be located anywhere in an programmable workstation. The microcomputers SM1, SM2, SM3, and SM4 have direct access to lot information from ORACLE database DB2. Each of the microcomputers SM1, SM2, and SM3, and SM4 has features including among other things, a CPU, a memory, a storage disk, a keyboard and a video display terminal, and ancillary circuits. The SM system can be installed in a fabrication facility F2 as in the case of unit SM4 where it rests in standby condition near a rack or it can be installed in an office as in the case of SM units SM1–SM4. Since lot information is stored in the ORACLE database DB2, any lot information in database DB2 is easily accessible because of the direct connection to microcomputers SM1, SM2, SM3, and SM4 thus, global lot search function can be accomplished directly from any one of the microcomputers loaded with the SM system.

In FIG. 2 the server is host computer H2.

Figure 3:
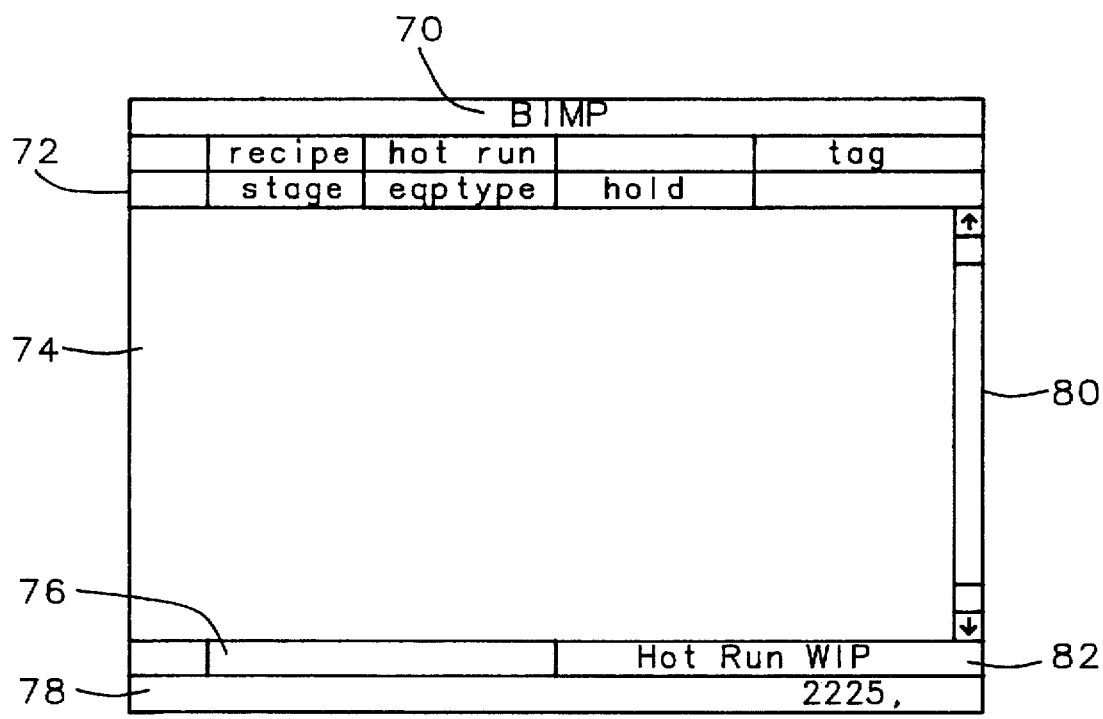
FIG. 3 shows a screen with the label BIMP 70 implant for the location in the fabrication plant.

FIG. 3 shows a screen with the label BIMP 70 implant for the location in the fabrication plant. The area 72 on the screen lists recipe, stage, hot run, eqptype, hold and tag spaces which serve the purpose of as follows: global lot search 72, data display area 74, data input area 76, Kanban message display area 78, vertical scroll bar 80 and hot run WI information display area 82.

The SM (Storage Manager) sub-system interface has fourteen (14) query functions to facilitate finding lots in whole fabrication plant. A set of Storage Manager (SM)

microcomputers SM1, SM2, SM3 are provided in the office and SM microcomputer SM4 is provided in the fabrication facility. The SM1–SM4 microcomputers are storage managing microcomputers implemented by Visual Basic (VB) programming language which can run in Windows 3.1.

Figure 4:
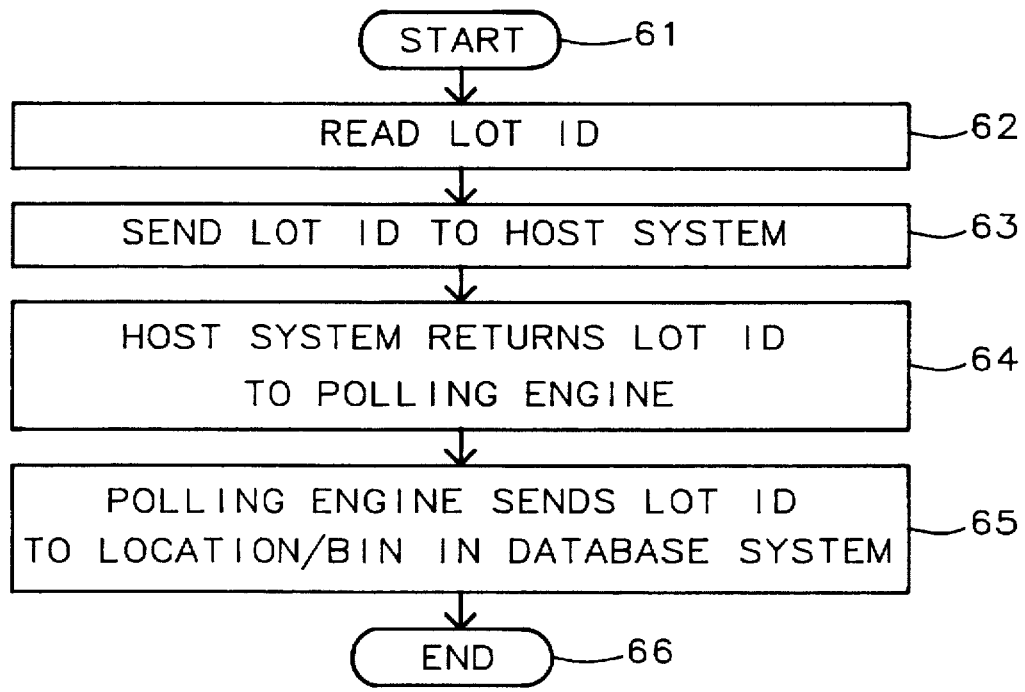
FIG. 4 shows a flow chart whereby when a pod is put on a tray, then a program routine is initiated with step 61 which leads to a step in which a polling engine reads the "lot ID" of the lot on the tray, packs the lot ID with a message to the host computer, etc.

FIG. 4 shows a flow chart whereby when a pod is put on tray, then a program routine is initiated with step 61 which leads to step 62 in which polling engine PE1 in FIG. 1 reads the "lot ID" of the lot on the tray. Next, in step 63, the polling engine PE1 packs transmits the "lot ID" with a "get lot info" SECSII message to the host system H1 loaded with the PROMIS plant manufacturing system program. Then in step 64, the host H1 (PROMIS) returns this "lot ID" information to the polling engine PE1. Then in step 65, the polling engine PE1 sends the "lot ID" information and location/bin information to the database system which is an ORACLE database.

Figure 5:
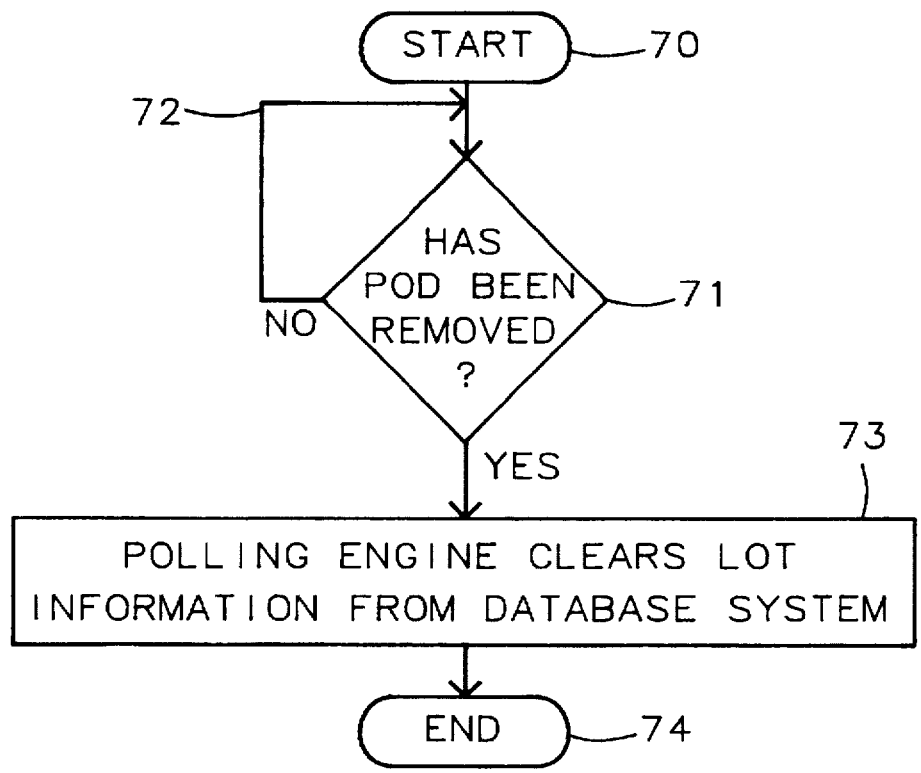
FIG. 5 shows a flowchart of a routine for dealing with pod removal.

FIG. 5 is a flowchart of a routine for dealing with pod removal. A program located in the polling engine PE1 is initiated at step 70. A test is made to determine whether a pod has been removed at step 71. If the test produces an answer of NO, then the program loops back on loop line 72 to make the test once again. If test 71 produces a YES answer, then the programs proceeds to step 73 in which the polling engine PE1 clears the associated lot information stored in ORACLE database in database system DB 226. Next, the routine ends in step 74.

A Manager can broadcast important messages to all SM installations through the Kanban sub-system. Manager issues Kanban messages to ORACLE database through Kanban sub-system location by location. SM periodically gets Kanban message from ORACLE database according to the configuration of SM. Thus SM can display a Kanban message in this way using the flow chart shown in FIG. 10 and described above.

Combined with a lot scheduling system, SM can implement the lot local dispatching function. Scheduling systems periodically schedule lots according information in the PROMIS plant manufacturing system, and stores them into ORACLE database. SM implements this function through the ORACLE database.

Figure 6:
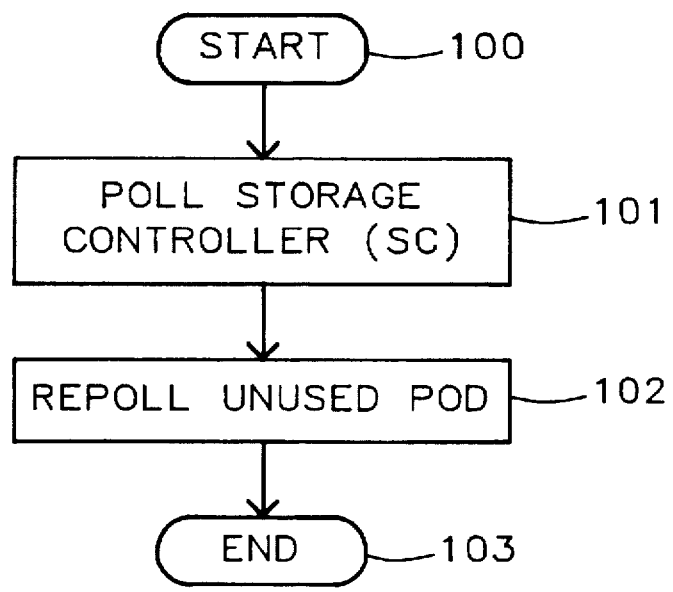
FIG. 6 shows a flowchart of a routine for dealing with an algorithm as the polling engine polls the storage controller.

Referring to FIG. 6, a flowchart of a routine for dealing with an algorithm, in step 101 the polling engine PE1 polls the storage controller in step 101 which is an Intel 8086 computer.

Since the storage controller always keeps the pod status in its internal register, unless it is reset, it is not necessary to regain its lot status from the PROMIS manufacturing system in host H1 if this pod has not been moved. The ORACLE database keeps the correct lot data. In an algorithm in accordance with this invention, re-polling of an unmoved pod is optional if ORACLE database can not keep correct lot data when something wrong (polling engine has been stopped and at the mean time, pod has been moved).

The polling of the storage controller is described above.

This Global View Storage Manager System can be integrated into a fabrication plant with a CIM (Computer Integrated Manufacturing) architecture. In a CIM system there is integration of office/accounting functions with automated factory systems. Point of sale, billing, machine tool scheduling and supply ordering are part of CIM. With this system, host computer loading is dramatically reduced.

Figure 7:
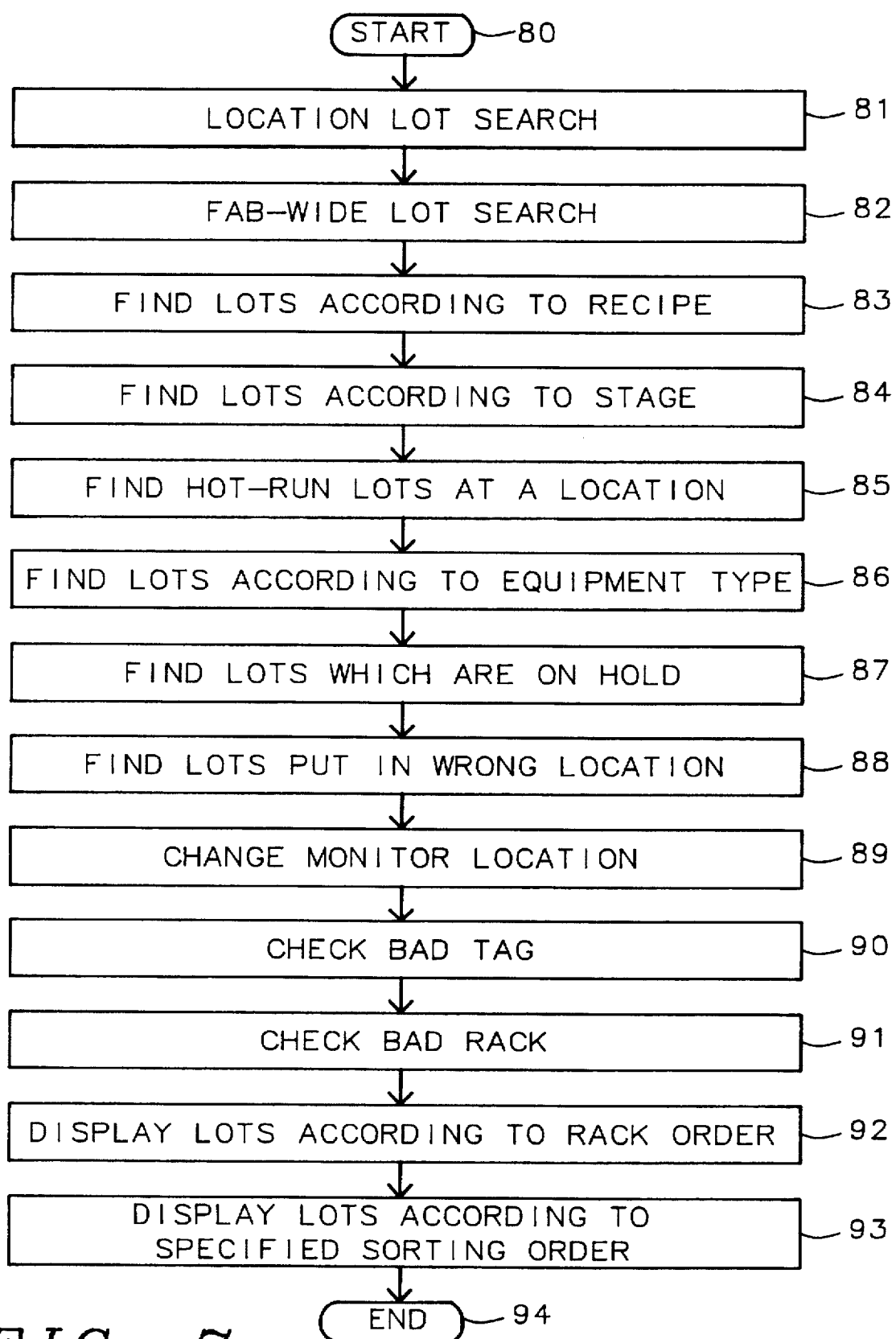
FIG. 7 is a flow chart for functions provided by the SM system in accordance with this invention.

FIG. 7 is a flow chart of SM for the 14 query functions as described below functions provided by the SM system in accordance with this invention. The subroutine begins with step 80 which leads to the sequence of steps as follows:

A location lot search step 81 involves the steps of searching the data base 266 for all lots which belong to a location.

In step 82 a fabrication plant-wide lot search is made of the entire data base 266 for a given lot ID.

In step 83 find lots according to recipe by searching the database 266 by the BIMP label 70 in FIG. 3.

In step 84 find lots according to stage in accordance with the above steps.

In step 85 find hot-run lots in a location by searching the database 266.

In step 86 find lots according to equipment type by searching the database 266.

In step 87 find lots which are in hold status found by searching the database 266.

In step 88 search the database 266 to find lots which are put in wrong location where PROMIS data has specified that a lot should be in a given location by the process of comparing the existing location with the location specified by PROMIS data to find a lot which is not in its home.

In step 89 if a TE desires to check the location of a lot, the TE can change the monitor location in the SM by use of this function.

In step 90 a check is made to identify a bad tag which exists when the tag malfunctions or when the battery is low. The steps used to check a bad tag are described in connection with FIG. 12, as described below.

In step 91 the system checks for bad rack which really refers to a bad storage controller. This function is performed as described below in connection with FIG. 12

In step 92 the system displays lots according to rack order. Each rack has tow storage controllers with each storage controller "named" with a unique ID status from 0 up to 31, at most. Each set of lot information in the database 266 has a storage controller associated therewith, so with the storage controllers it is possible to determine the rack order.

In step 93 display lots according to specified sorting order (equipment type, stage, recipe, part, technology). After triggering the search function, the user can change the lot display order by choosing one of a set of conventional sorting functions.

In step 94 the routine ends with an Exit.

Figure 8:
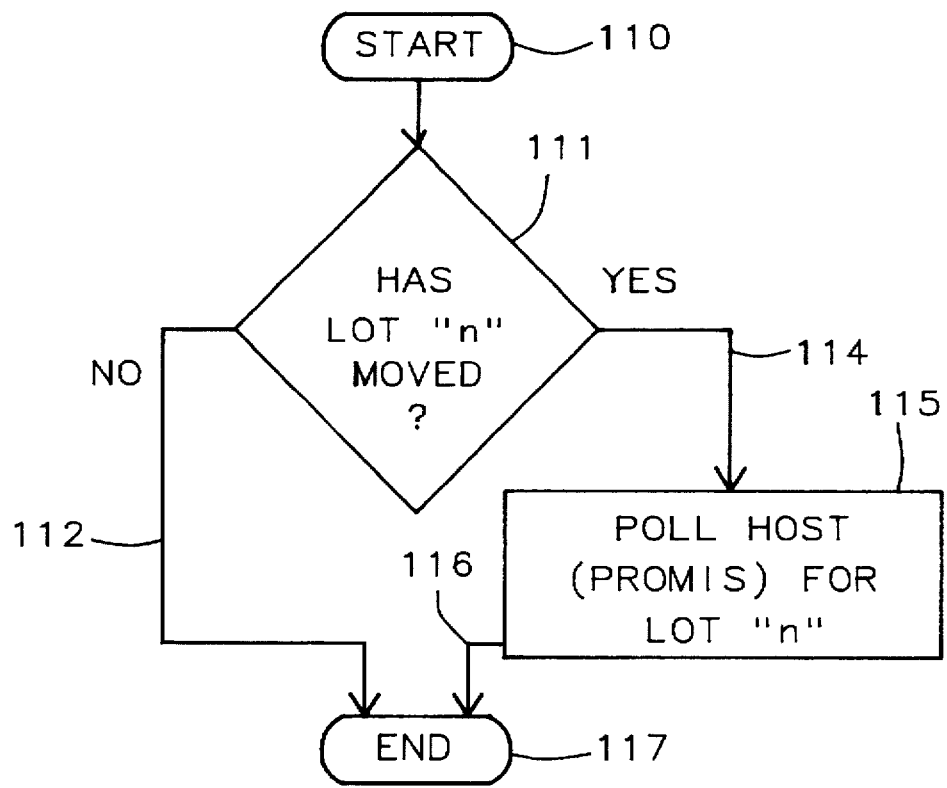
FIG. 8 shows a flow chart of a subroutine leading to a decision step where the test is made as to whether lot "n", which is a positive integer less than infinity of a lot in the fabrication plant, has moved since the last test, etc.

FIG. 8 shows a flow chart of a subroutine intimated by start step 110 leading to decision step 111 where the test is made as to whether lot "n", which is a positive integer less than infinity of a lot in the fabrication plant, has moved since the last test. If yes the result on line 114 leads to step 115 in which the system polls the host for data on lot "n" and then following test 111 the routine moves via line 116 to END step 117 to terminate the routine for the lot "n". If the result of the test in step 111 is NO, the result on line 112 leads to END step 117.

5. Not only can the Storage Management System (SMS) in fabrication plant query lots but the Storage Management System (SMS) in office can query those lots also. SM1 and SM4 in FIG. 2 have exactly the same function. SM can be located anywhere in a company because SM links to the database 266. There is no difference between an SM in an office or in the fabrication facility which is the outstanding feature of the present system.

Figure 9:
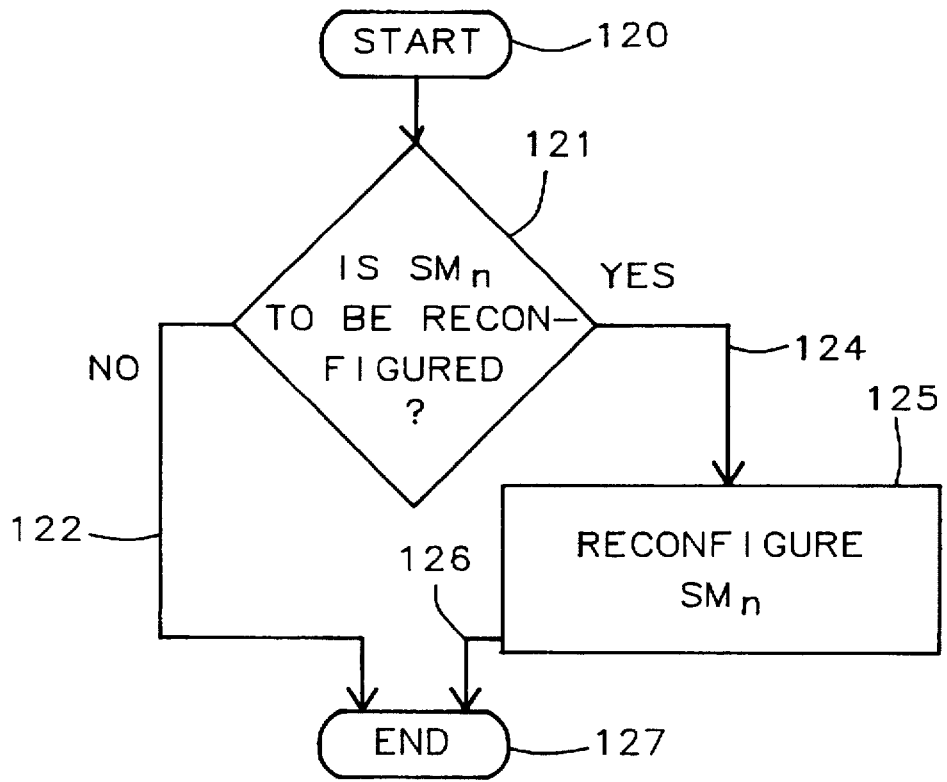
FIG. 9 shows a routine for dealing with pod removal run to test for lot "n", which routine can be run for each of the lots "n".

Referring to FIG. 9, the SM system can also be on-line and dynamically reconfigured to perform a specific task at each location to any SM installation at any other location in the network. For example, an SM installation at an IMP (Implant) location can be reset to operate with the DRY (Dry deposition) location, if it becomes necessary to do so. With this flexibility, an SM installation can backup another SM installation, easily.

FIG. 9 shows a routine run to test for lot "n". The routine can be run for each of the lots "n". Referring to FIG. 9, a flowchart is shown for a routine for dealing with pod removal. A program located in SM is initiated at step 120. A test is made to determine whether a workstation $SM_n$ it to be reconfigured at step 121. If the test produces an answer of NO, then the program goes on line 122 to end at step 127. If test 121 produces a YES answer, then the programs proceeds via line 124 to step 125 in which the system reconfigures the workstation $SM_n$. Next, the routine ends in step 127.

Referring to FIG. 10, a high level flow chart shows how the Kanban function is added to the SMS. Step 130 involves passing security control of the Kanban system, which leads to step 132 in which the supervisor program updates the Kanban message for a location or a group of locations in the database 226. In addition, in step 136, the storage management system, which receives data from database 226, periodically receives Kanban messages from the database 226 and displays it to the technical engineer on a display monitor.

Referring to FIG. 11, a high level flow chart which shows how functions are added to the SMS. In step 140, the lot scheduler 140 periodically runs the PROMIS plant manufacturing system in the host H1 computer in FIG. 1C. Step 142 follows and it updates the database 226 on the lot dispatching list. Next, in step 144, the technical engineer operating a terminal interactively selects lots according to the dispatching lot list.

Referring to FIG. 12, a flowchart for diagnostic hardware (storage controller, Tag, Tray) status. The routine for FIG. 12 is a high level flow chart to show how such diagnostic hardware status data is produced. Starting with step 150, the polling engine PE1 in FIG. 1C communicates with the next storage controller. Next in step 152 a decision is made as to whether communication has failed. If YES, then the decision is made as to where there have been more than three retries in step 154. If NO, then the step 157 follows.

In test 154, if YES, then the system goes to step 156 which reports to the database 266 and returns back to step 150 for further processing in the next cycle, with the next storage controller in sequence.

In test step 158, the system decides whether the read failed. If YES, then the program goes to step 160. If NO, then the program goes to step 159. In step 159, the system gets lot information from PROMIS in the host computer H1. After step 159, the program returns to step 150 for the next cycle.

In test 160, the decision is made as to whether the attempt to read the tag if the pod failed more than three times. If NO, then the program returns to initiate step 157 once more. If YES, then program proceeds to step 162 in which the data is reported to the data base 266. Following step 162, the program returns to step 150 for the next cycle.

Referring to FIG. 13, a flowchart of a routine for On time display hot run WIP (Work In Progress wafer). FIG. 13 is a high level flow chart to show how this function is performed. The program initiates with step 170 during which a 30 second time is started. Next, in step 172, it is determined that the 30 second timer has expired. In the following step 174, a test is made to determine whether a "priority 1" lot exists in the data base 266 for some location. If NO, then the program returns back to step 170 to start once more. If YES, then the system shows a hot run WIP message to the user followed by returning back to step 170 to start once more.

SUMMARY

Storage Management System (SMS)
1. Functions
   a. Facilitates searching lots in global view.
   b. Displays lots for dispatching system.
   c. Displays Kanban messages/announcements with security control
2. Features
   I. Distributed
      a. Client-server
         the PROMIS system in host, Storage Management System
         (SMS) in microcomputer, i.e. (PC)
      b. SMS includes two sub-systems
         i. Polling engine—a control unit, real time monitor pod states
         ii. Storage manager—graphical user interface, can support many, e.g. fourteen (14), functions for users to find lots
      c. Reliability enhancement
         Two sub-systems run in different computers
      d. Open
         QNX—a multiuser, multitasking realtime UNIX-like operating system for PC's.
         The network is TCP/IP (Transmission Control Protocol/Internet Protocol);
         MS Windows, most popular Operating System in the world.
   II. Database
      e. Global database
         ORACLE database stores whole fabrication plant WIPS;
   III. Graphical User Interface (GUI)
      f. colorful graphical user interface.
      g. Chinese mode
3. Advantage
   I. Diagnostic
      a. Hardware diagnostic functions
         diagnostic storage controller, TRAY, TAG
   II. Load-balancing
      b. Dramatically reduce host loading
         Central Processing Unit (CPU) workload is reduced from 80% to 30%
         Input/Output (IO) workload is reduced significantly, e.g. from 450 to 100 at each sample time
      c. Reduces the PROMIS system loading
         no extra request to the PROMIS system is needed if pod not being moved when system is restarted
      d. Portability
         SMS can be applied in numerous fabrication plants.
   III. Flexibility
      e. Configurable
         SM can be dynamic configured to other station
      f. Interoperability
         Interoperation with other application systems (Kanban)
         Data accessible through database
         Interchangeable for people through unified GUI
      g. Backup
         All SM units can backup each other
      h. Integrate with Office and Factory SM can be installed not only in fabrication plant but also in office i. Function extensible The present invention comprises a data processing system with features as follows:

1. Separates Storage Management System (SMS) into two sub-systems with one operating as a backend control system and the other operating as a front end graphical user interface.
2. Supports global(fabrication plant-wide) lot search.
3. Supports the Kanban message function.
4. Supports lot local dispatching function.
5. Supports Chinese mode graphical user interface.
6. Performs a hardware diagnostic function.
7. Provides an on time display of hot run WIP.
8. Dynamically configures to SM (Storage Management) at other locations.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A computer operated method of management of data in a database system, and workstations in several different functional locations configured to perform a specific task at each location comprising the steps as follows:

said database system being used for controlling a manufacturing operation, said manufacturing operation including a plurality of pods and a rack which holds at least one pod, said pods being adapted to hold a wafer cassette and each of said pods having a tag attached thereto, said rack including a storage controller associated therewith, reading data from said tags on said pods for lots in said pods in said plant, sending said data through a polling engine which maintains correct lot information in said database system for transmission to a database system, supplying data from said database system to a plurality of programmable workstations linked lines in a star network to said database.

2. A method in accordance with claim 1 wherein:

said polling engine polls every storage controller in a said rack for pods which have arrived and have been removed, and testing whether a pod has arrived and if so getting lot information and packing the lot location and sending said data to said database, and otherwise testing whether said pod has been removed and if so clearing lot information from said said database system.

3. A method in accordance with claim 1 including:

dynamic on-line reconfiguring said storage management programmable workstations by sending thereto reconfiguring signals over said star network, whereby said programmable workstation is reconfigured to perform the function of a different functional location.

4. A method in accordance with claim 1 including:

providing security control between said database system and said programmable workstations.

5. A method in accordance with claim 1 including:

providing a graphical user interface checking by making a test for bad tags, if the tag did not fail the test, then getting lot information from a manufacturing system in said plant, and if the tag failed the test returning to checking by making said test for bad tags at least one more time and if said tag fails repeatedly then reporting said failure to said database system.

6. A computer operated method of management of data in a database system in a manufacturing plant for a manufacturing operation with workstations in several different functional locations configured to perform a specific task at each location said method comprising the steps as follows:

said database system being used for controlling a manufacturing operation, said manufacturing operation including a plurality of pods and a rack which holds at least one pod, said pods being adapted to hold a wafer cassette and each of said pods having a tag attached thereto, said rack including a controller associated therewith, reading data from said tags on said pods for lots in said pods in said plant, sending said data through a polling engine which maintains correct lot information in said database system for transmission to said database system, communicating between said polling engine and a host computer containing lot information, supplying data from said database system to a plurality of storage management programmable workstations linked lines in a star network to said database.

7. A method in accordance with claim 6 wherein:

said polling engine polls every storage controller in a said rack for pods which have arrived and have been removed, and testing whether a pod has arrived and if so getting lot information and packing the lot location and sending said data to said database, and otherwise testing whether said pod has been removed and if so clearing lot information from said database system.

8. A method in accordance with claim 6 including:

dynamic on-line reconfiguring said storage management programmable workstations by sending thereto reconfiguring signals over said star network, whereby said programmable workstation is reconfigured to perform the function of a different functional location.

9. A method in accordance with claim 6 including:

providing a graphical user interface, checking by making a test for bad tags, if the tag did not fail the test getting lot information from a manufacturing system in said plant, and if the tag failed the test returning to checking by making said test for bad tags at least one more time and if said tag fails repeatedly then reporting said failure to said database system.

10. A method in accordance with claim 6 including:

providing a colorful graphical user interface.

11. A computer system for management of data in a database system in a manufacturing plant for a manufacturing operation with workstations in several different functional locations configured to perform a specific task at each location comprising the steps as follows:

said database system being used for controlling a manufacturing operation, said manufacturing operation including a plurality of pods and a rack which holds at least one pod, said pods being adapted to hold a wafer cassette and each of said pods having a tag attached thereto, said rack including a controller associated therewith, means for reading data from said tags on said pods for lots in said pods in said plant, means for sending said data through a polling engine which maintains correct lot information in said database system for transmission to a database system, means for supplying data from said database system to a plurality of programmable workstations linked lines in a star network to said database.

12. A system in accordance with claim 11 wherein:

said polling engine polls every storage controller in a said rack for pods which have arrived and have been removed, and testing whether a pod has arrived and if so getting lot information and packing the lot location and sending said data to said database, and otherwise testing whether said pod has been removed and if so clearing lot information from said database system.

13. A system in accordance with claim 11 including:

dynamic on-line reconfiguring said storage management programmable workstations by sending thereto reconfiguring signals over said star network, whereby said programmable workstation is reconfigured to perform the function of a different functional location.

14. A system in accordance with claim 11 including:

providing security control between said database system and said programmable workstations.

15. A system in accordance with claim 11 including:

providing a graphical user interface, checking by making a test for bad tags,
    if the tag did not fail the test, then getting lot information from a manufacturing system in said plant, and
    if the tag failed the test returning to checking by making said test for bad tags at least one more time and if said tag fails repeatedly then reporting said failure to said database system.

16. A computer operated system in a manufacturing plant for management of data of a manufacturing operation with workstations in several different functional locations configured to perform a specific task at each location comprising the steps as follows:

said database system being used for controlling a manufacturing operation, said manufacturing operation including a plurality of pods, a rack which holds at least one pod, said pods being adapted to hold a wafer cassette and each of said pods having a tag attached thereto, said rack including a controller associated therewith, reading data from said tags on said pods for lots in said pods in said plant, sending said data through a polling engine which maintains correct lot information in said database system for transmission to a database system, communicating between said polling engine and a host computer containing lot information, supplying data from said database system to a plurality of storage management programmable workstations linked lines in a star network to said database.

17. A system in accordance with claim 16 wherein:

said polling engine polls every storage controller in a said rack for pods which have arrived and have been removed, and testing whether a pod has arrived and if so getting lot information and packing the lot location and sending said data to said database, and otherwise testing whether said pod has been removed and if so clearing lot information from said database system.

18. A system in accordance with claim 16 including:

dynamic on-line reconfiguring said storage management programmable workstations by sending thereto reconfiguring signals over said star network, whereby said programmable workstation is reconfigured to perform the function of a different functional location.

19. A system in accordance with claim 16 including:

providing a graphical user interface, checking by making a test for bad tags,
    if the tag did not fail the test, then getting lot information from a manufacturing system in said plant, and
    if the tag failed the test returning to checking by making said test for bad tags at least one more time and if said tag fails repeatedly then reporting said failure to said database system.

20. A system in accordance with claim 16 including:

providing a colorful graphical user interface.

\* \* \* \* \*